US009488691B2

(12) United States Patent
Escobar et al.

(10) Patent No.: US 9,488,691 B2
(45) Date of Patent: Nov. 8, 2016

(54) INTEGRATED CIRCUIT CONTROL BASED ON A FIRST SAMPLE VALUE AND A DELAYED SECOND SAMPLE VALUE

(71) Applicant: NXP B.V., Eindhoven (NL)

(72) Inventors: Juan Echeverri Escobar, Eindhoven (NL); Surendra Guntur, Eindhoven (NL); Manvi Agarwal, Eindhoven (NL); Rinze Ida Mechtildis Peter Meijer, Herkenbosch (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/718,294

(22) Filed: May 21, 2015

(65) Prior Publication Data
US 2015/0372666 A1   Dec. 24, 2015

(30) Foreign Application Priority Data
Jun. 19, 2014   (EP) .................................. 14173127

(51) Int. Cl.
| | | |
|---|---|---|
| *G01R 31/28* | (2006.01) | |
| *G01R 31/317* | (2006.01) | |
| *G01R 31/3193* | (2006.01) | |
| *H03K 3/037* | (2006.01) | |

(52) U.S. Cl.
CPC ... *G01R 31/31725* (2013.01); *G01R 31/31727* (2013.01); *G01R 31/31937* (2013.01); *H03K 3/0375* (2013.01)

(58) Field of Classification Search
CPC .................. G01R 31/31725; G01R 31/31726; G01R 31/31727; G01R 31/31937; H03K 3/0375

USPC ........ 327/28, 50, 91, 97, 509, 564; 714/699, 714/726, 731
See application file for complete search history.

(56) References Cited

U.S. PATENT DOCUMENTS

| | | | | |
|---|---|---|---|---|
| 5,642,487 A | * | 6/1997 | Flynn ................. | G01R 31/3016 710/52 |
| 7,827,454 B2 | * | 11/2010 | Kurimoto ........ | G01R 31/31858 324/535 |
| 8,350,589 B2 | * | 1/2013 | Chlipala .......... | G01R 31/31858 326/16 |
| 8,536,919 B1 | * | 9/2013 | Chan .................... | H03K 3/0375 327/199 |
| 2009/0024888 A1 | | 1/2009 | Kurimoto | |
| 2009/0115468 A1 | | 5/2009 | Berthold et al. | |
| 2011/0060975 A1 | | 3/2011 | Pappalardo et al. | |
| 2013/0031154 A1 | * | 1/2013 | Wiencke ............... | G06F 7/5312 708/629 |

OTHER PUBLICATIONS

Kahng, Andrew B. et al; "Slack Redistribution for Graceful Degradation Under Voltage Overscaling"; Proc. of ASPDAC, Taipei, Taiwan; pp. 825-831 (Jan. 2010).

(Continued)

*Primary Examiner* — William Hernandez

(57) ABSTRACT

An integrated circuit comprises: a first processing stage comprising processing logic for performing a processing operation on an input signal to generate an output signal, wherein the input signal corresponds to an output signal of a previous processing stage; a first sampling element adapted to sample a first value of said output signal synchronously with a clock signal; a second sampling element adapted to sample a second value of said output signal synchronously with a first delayed clock signal; and a first delayed clock signal generator, adapted to selectively generate said first delayed clock signal in response to a control signal generated in said previous processing stage.

16 Claims, 6 Drawing Sheets

(56) References Cited

OTHER PUBLICATIONS

Uht, Augustus K.; "Going Beyond Worst-Case Specs with TEAtime,"; Computer, IEEE Computer Society, vol. 37; pp. 51-56 (Mar. 2004).

Ernst, Dan et.al; "Razor: Circuit-Level Correction of Timing Errors for Low-Power Operation"; IEEE Micro, vol. 24, Issue 6; pp. 10-20 (Dec. 2004).

Das, Shidhartha et.al; "RazorII: In Situ Error Detection and Correction for PVT and SER Tolerance"; IEEE Journal of Solid-State Circuits, vol. 44, No. 1; pp. 32-48 (Jan. 2009).

Choudhury, Mihir et.al; "Timber: Time borrowing and error relaying for online timing error resilience"; Proc. of Date, Dresden, Germany, IEEE; pp. 1554-1559 (Mar. 2010).

Extended European Search Report for application No. 14173127.3 (Dec. 8, 2014).

\* cited by examiner

INTEGRATED CIRCUIT CONTROL BASED ON A FIRST SAMPLE VALUE AND A DELAYED SECOND SAMPLE VALUE

CROSS-REFERENCE TO RELATED APPLICATIONS

This application claims the priority under 35 U.S.C. §119 of European patent application no. 14173127.3, filed Jun. 19, 2014 the contents of which are incorporated by reference herein.

FIELD OF THE INVENTION

This invention relates to an integrated circuit, and relates particular, but not exclusively, to a synchronous digital integrated circuit, parts of which may be under-designed for area reduction.

BACKGROUND OF THE INVENTION

In modern CMOS design, integrated circuit (ICs) are designed such that the product operates correctly under a range of operating conditions (e.g. voltage, temperature, wear) and despite some variations in process conditions. Traditional IC design approaches are typically based on the inclusion of margins to account for different process and operating conditions. In modern CMOS design, the most common technique for timing, power and area optimisation is corner-based. These design "corners" contain timing and power information of cells and macros under different process and operating conditions. To fulfil a minimum performance requirement, the IC design is optimised for operation under the worst-case combination of conditions: slow process, high temperature, large voltage drops, etc. This strategy results in a pessimistic design having a larger area and higher power consumption than would be would be the case if the IC were optimized for typical conditions, because the worst-case combination of conditions rarely occurs.

Ideally, the designer would like to design for the "typical" corner (that is, for typical process and operating conditions). However, that would result in timing violations if the IC does not correspond to a typical sample or is not operated under typical conditions.

Multiple techniques have been proposed for designing in less pessimistic corners and multiple techniques have been proposed for dealing with consequential timing violations in sequential elements that may occur with worst-case conditions.

FIG. 1 shows a classic five-stage MIPS processor, in which the various stages of the processor are separated from each other through pipelines (sequential elements such as flip-flops). In this case the pipeline stages are: PC, IF/ID, ID/EX, EX/MEM, and MEM/WB. When the processor of FIG. 1 is implemented, some performance requirements are pursued. For example, the processor may be required to run at 1 GHz. These performance requirements need to be fulfilled over a range of possible conditions. The conditions are summarised by so called "PVT corners" (process, voltage and temperature). To achieve the desired performance in every corner, the synthesis tools trade off performance against area. The slower the PVT corner, the greater the area used in the implementation of the processor.

Designing for the worst-case combination of conditions therefore requires extra area to provide margin for an unlikely combination of events. A set of techniques collectively known as better-than-worst-case design (BTWC) address this problem. BTWC design approaches enable power consumption to be reduced by optimising for better-than-worst-case operating conditions, or even for typical operating conditions, rather than worst-case conditions. In BTWC, the spread of the PVT corner is reduced. For example, if the process variability can be modelled as a Gaussian distribution having a variance of a, a worst-case design approach will assume that the process conditions range from $-3\sigma$ to $+3\sigma$ around typical conditions and the integrated circuit design will be optimised between these two boundaries. In contrast, BTWC will assume that the process conditions range from, for example, $-2\sigma$ to $+2\sigma$. Assuming a lower process spread in this manner will reduce the IC area, but it will also reduce the number of samples of the product that achieve the desired performance. Multiple techniques have been proposed to regain yield, by addressing the timing violations which occur when the IC is operated under conditions outside of the range for which it has been designed.

SUMMARY OF THE INVENTION

According to a first aspect of the invention, there is provided an integrated circuit comprising:

a first processing stage comprising processing logic for performing a processing operation on at least one input signal to generate at least one output signal, wherein said input signal corresponds to an output signal of a previous processing stage;

a first sampling element adapted to sample a first value of said output signal synchronously with a clock signal;

a second sampling element adapted to sample a second value of said output signal synchronously with a first delayed clock signal; and a first delayed clock signal generator, adapted to selectively enable said first delayed clock signal, in response to a control signal generated in said previous processing stage.

By including first and second sampling elements adapted to sample first and second values of the output signal synchronously with a clock signal and a first delayed clock signal respectively, the integrated circuit is able handle timing violations which may occur under some conditions as a consequence of parts of the processing logic being designed for BTWC conditions, for example, to reduce area margin. Selective enablement of the first delayed clock signal helps to reduce or avoid the occurrence of the so-called "hold problem" associated with double-sampling elements. This may avoid incurring the further area overhead associated with providing circuitry for dealing with this problem.

The processing logic may comprise a functional unit.

It has been found that functional units (eg. multiplier or divider) require a lot of area margin. Therefore applying the present invention to a processing stage comprising a functional unit may therefore enable significant area reduction.

The control signal may be generated by said previous processing stage when said functional unit is to be used.

By generating the control signal in the previous processing stage when the functional unit is to be used, the "hold problem" associated with double sampling elements is reduced or avoided because short paths through the processing stage which do not cross the functional unit are not sampled by the second sampling element and therefore do not result in hold violations. For example, the control signal may be generated in the previous processing stage when an instruction to use the functional unit is received or decoded.

The previous processing stage may be a decode processing stage.

The timing of the control signal may be controlled by a pipeline advance signal.

This feature may ensure that the control signal is generated at the appropriate time, for example when the instruction to use said functional unit advances to the first processing stage comprising the functional unit. This may be useful if a current instruction stalls in the first processing stage comprising the functional unit, or if a current instruction in the first processing stage comprising the functional unit is a multi-cycle instruction and the functional unit is not pipelined.

The functional unit may comprise a multiplier or divider.

It has been found that multipliers and dividers contribute significantly to area margin. The application of the present invention to these functional units may therefore enable significant area reduction.

A maximum time for completing said processing operation may be less than the sum of a period of the clock signal and a delay between the clock signal and the first delayed clock signal.

This ensures that, when a timing violation occurs such that the first sampling element samples an incorrect value of the output signal, the processing operation is completed by the timing of the first delayed clock signal such that the second sampling element samples the correct value of the output signal.

The first delayed clock signal may correspond to the clock signal delayed by a fraction of a period of the clock signal.

The output signal of the first processing stage may become the input signal of a following processing stage.

The first and/or second sampling element may be a flip-flop.

The integrated circuit may further comprise comparison circuitry for comparing said first value and said second value of said output signal and for generating an error signal if said first and second values are different;

wherein, if said first value and said second value are different, said second value is propagated to the following processing stage.

A difference between the first and second values of the output signal indicates that the signal took longer than the usual clock period to propagate through the processing stage. Sampling the value of the output signal synchronously with a delayed clock signal thereby enables the correct value of the output signal to be propagated to the following processing stage.

In one embodiment a next cycle of the clock signal may be disabled in response to the error signal.

By disabling the next clock signal, the integrated circuit is given two times the period of the clock signal to recover from the error.

In another embodiment, the first delayed clock signal is propagated to the following processing stage in response to the error signal.

By propagating the first delayed clock to the following processing stage, the full system is given the period of the clock signal plus the delay between the clock signal and the delayed clock signal to recover from the error.

In another embodiment, the following processing stage comprises:

Further processing logic for performing a processing operation on said output signal to generate at least one further output signal; a third sampling element adapted to sample a first value of said further output signal synchronously with the clock signal;

a fourth sampling element adapted to sample a second value of said further output signal synchronously with a second delayed clock signal;

a second delayed clock signal generator, adapted to selectively enable said second delayed clock signal in response to said error signal.

In this approach, the error of the first processing stage is masked if the signal propagates through the following processing stage in a time which is less than the clock period minus the delay. If there is an error in the following processing stage, the correct value of the further output signal will be correctly sampled by the fourth sampling element. However, the probability of two critical paths being executed in consecutive processing stages is much lower than the probability of an error occurring in the first processing stage. The second delayed clock signal may correspond to the first delayed clock signal, or may be generated from the clock signal or the first delayed clock signal.

The integrated circuit may comprise a data processor.

The integrated circuit may comprise a micro controller, a digital signal processor or a graphics processing unit.

BRIEF DESCRIPTION OF THE DRAWINGS

Preferred embodiments of the present invention will now be described, by way of example only and not in any limitative sense, with reference to the accompanying drawings, in which.

DETAILED DESCRIPTION OF EMBODIMENTS

Figure 1:
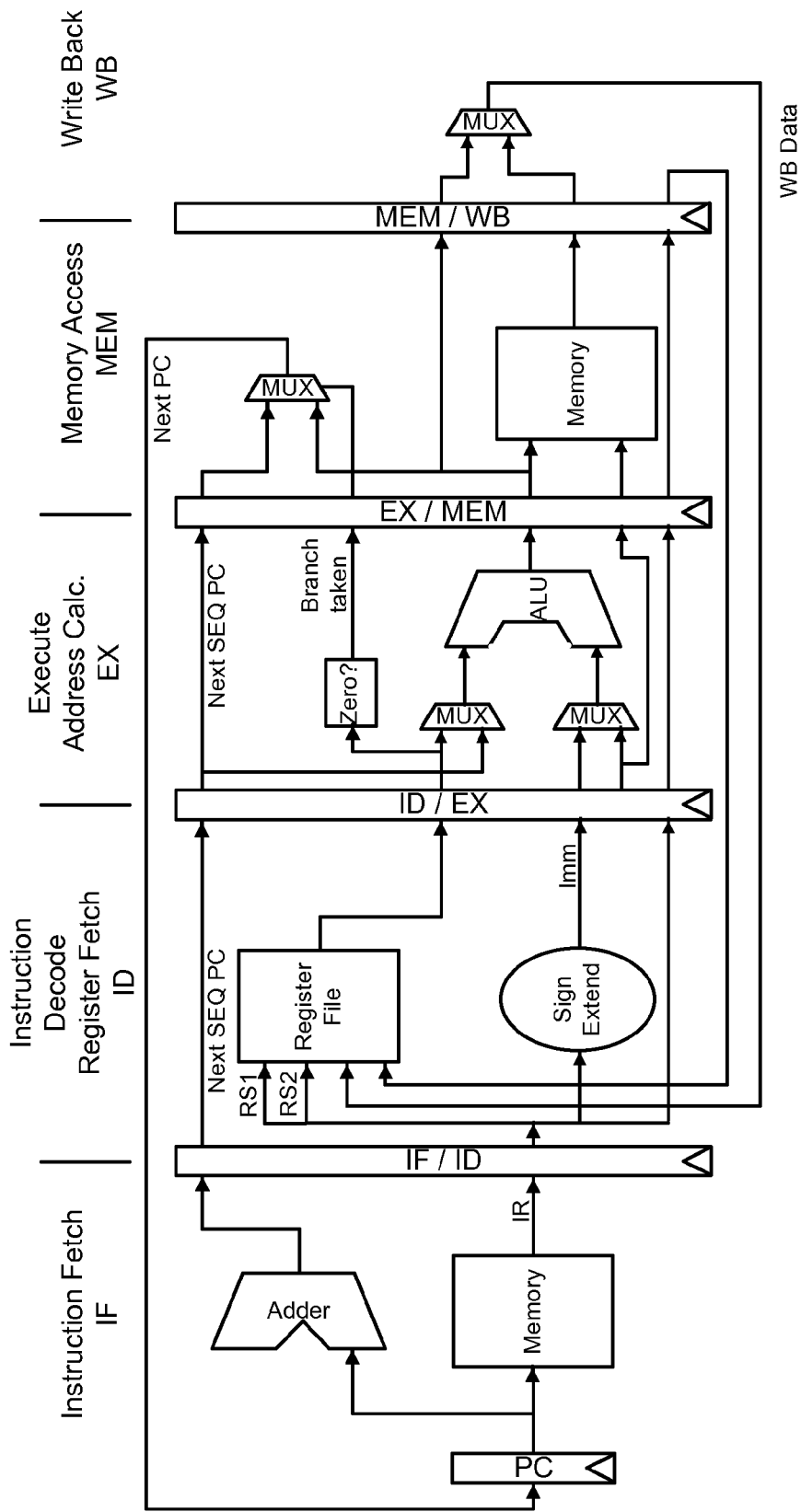
FIG. 1 shows a conventional five-stage MIPS processor.
Figure 2:
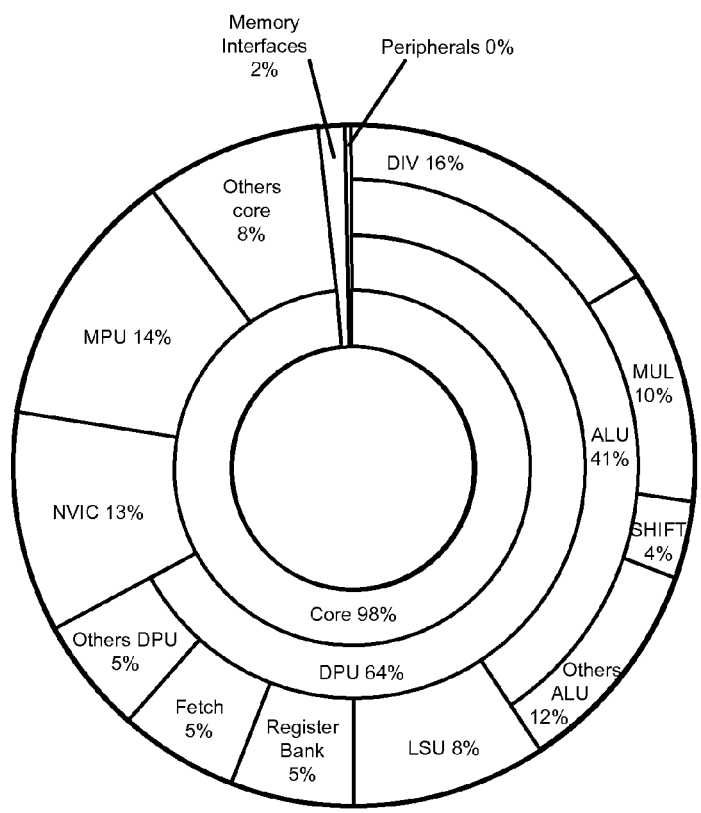
FIG. 2 shows an analysis of area overhead for a commercial micro controller.

FIG. 2 illustrates the relative area increase of different modules of a commercial microcontroller, for an IC design optimised for the slowest or worst corner (i.e. the worst-case combination of conditions) compared with a design optimised for the typical corner. The innermost ring of FIG. 2 shows that 90% of the area increase between the typical and worst corners arises from the core, with the memory interfaces and peripherals contributing only 2% of the area increase. Moving inwards, successive rings of FIG. 2 break down the largest contribution identified in the previous ring into its constituent parts. The outermost ring of FIG. 2 shows that the divider and multiplier typically contribute 16% and 10% respectively of the area increase between the typical corner and worst (slowest) corner.

FIG. 2 shows that functional units, such as multipliers and dividers, require a large area margin. That is, these functional units contribute to a significant proportion of the area increase when designing the microcontroller for the worst-case combination of process and operating conditions, as compared to designing these functional units for typical conditions. The present invention enables area margin to be reduced by designing some or all functional units of an integrated circuit using a BTWC design approach, e.g. by designing one or more functional units to be robust to, for example, a 1σ or 2σ variation in process and operation conditions, rather than the usual 3σ range.

Figure 3A:
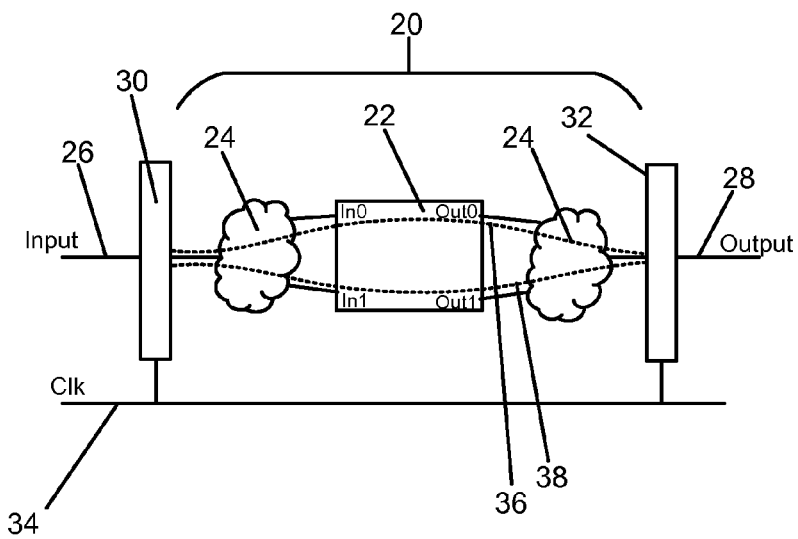
FIG. 3A illustrates selected path constraining.

This may be achieved using standard synthesis/place and route tools though selective path constraining. This is illustrated in FIG. 3A. FIG. 3A illustrates a processing stage 20 comprising processing logic 22, 24 for performing a processing operation on at least one input signal 26 to generate at least one output signal 28. The input signal corresponds to an output signal of a previous processing stage (not shown in FIG. 3A). The processing logic 22, 24 includes a functional unit 22 and other processing logic 24. The input signal 26 is propagated from an input flip-flop 30, through the processing logic 22, 24 to a receiving flip-flop 32. Both the input flip-flop 30 and receiving flip-flop 32 are clocked by a clock signal 34.

Two data paths 36 and 38 through the processing stage 20 are shown. All possible data paths are expected to propagate through the processing stage 20 without error, for all expected combinations of process and operating conditions. Using a conventional design strategy, both paths 36, 38 would be constrained to have a maximum propagation delay no greater than the period of the clock signal 34, so that the correct value of the output signal 28 is sampled by the receiving flip-flop 32 on the next cycle of the clock signal 34. As an example, the clock signal 34 may have a frequency of 100 MHz and thus a period of 10 nanoseconds, in which case the maximum propagation delay of the paths 36, 38 through the processing stage 20 is 10 nanoseconds. Using selective path constraining, the design constraint for one or more of the paths 36, 38 crossing the functional unit 22 may be relaxed. For example, path 36 may be designed to have a maximum propagation delay of 15 nanoseconds. Under typical process and operating conditions (for example, under conditions within 2σ of the mean), the actual propagation delay along path 36 may still be less than the clock period of 10 nanoseconds and the receiving flip-flop 32 will sample the correct value of the output signal 28. However, under worst-case conditions (for example, under conditions between 2σ and 3σ from the mean), the propagation delay along path 36 will be greater than the 10 nanosecond clock period, up to the 15 nanosecond maximum propagation delay, and the receiving flip-flop 32 will latch the wrong value of the output signal 28, resulting in an error.

Figure 3B:
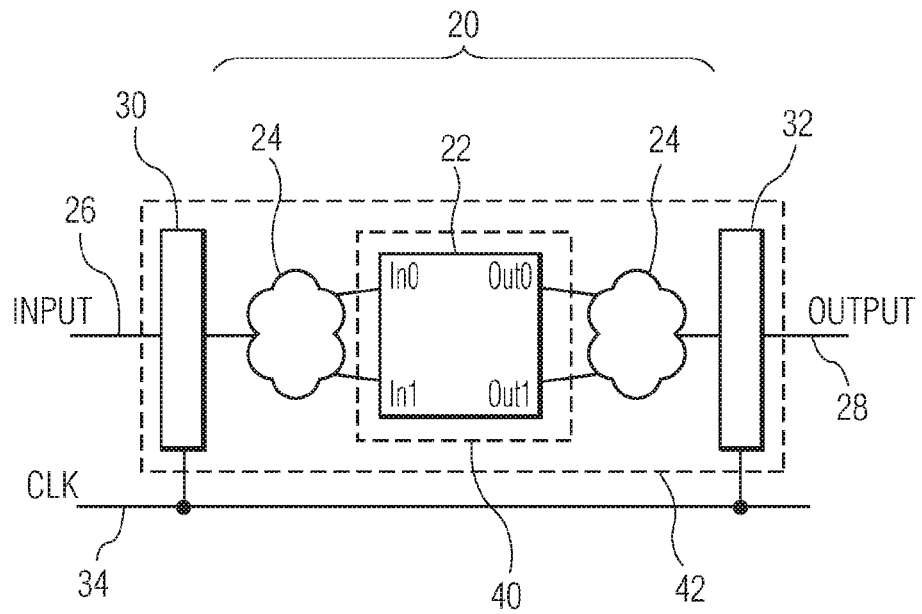
FIG. 3B illustrates use of a power domain to selectively implement BTWC design.

FIG. 3B illustrates an alternative BTWC design approach for designing one or more functional units. A power domain 40 is created for the functional unit 22, and the functional unit 22 is designed using libraries characterised for BTWC design. The other elements correspond to those of FIG. 3A having the same reference numbers. Again, standard synthesis/place and route tools may be used. In this example, the default power domain 42 is optimised for conditions ranging from −3σ to +3σ around typical conditions, whereas the performance requirement for the BTWC power domain 40 is relaxed to 2σ each side of the mean. In this way, the area of the functional unit 22 is reduced. Although only one functional unit 22 is shown, a single power domain 40 may contain multiple functional units.

By optimizing the functional unit 22 or selective paths 36, 38 through the functional unit 22 for a smaller range of process or operating conditions, the area of an integrated circuit may be reduced. However, if a given functional unit 22 is designed for a 2σ range of conditions, and the actual sample is produced and/or operated at conditions corresponding to 36 (i.e. at a worst-case combination of conditions), the propagation delay through the functional unit 22 in that sample will be longer than the clock period. As a result, the receiving flip-flop 32 will latch the wrong value of the output signal 28, before the processing operation is complete.

Figure 4:
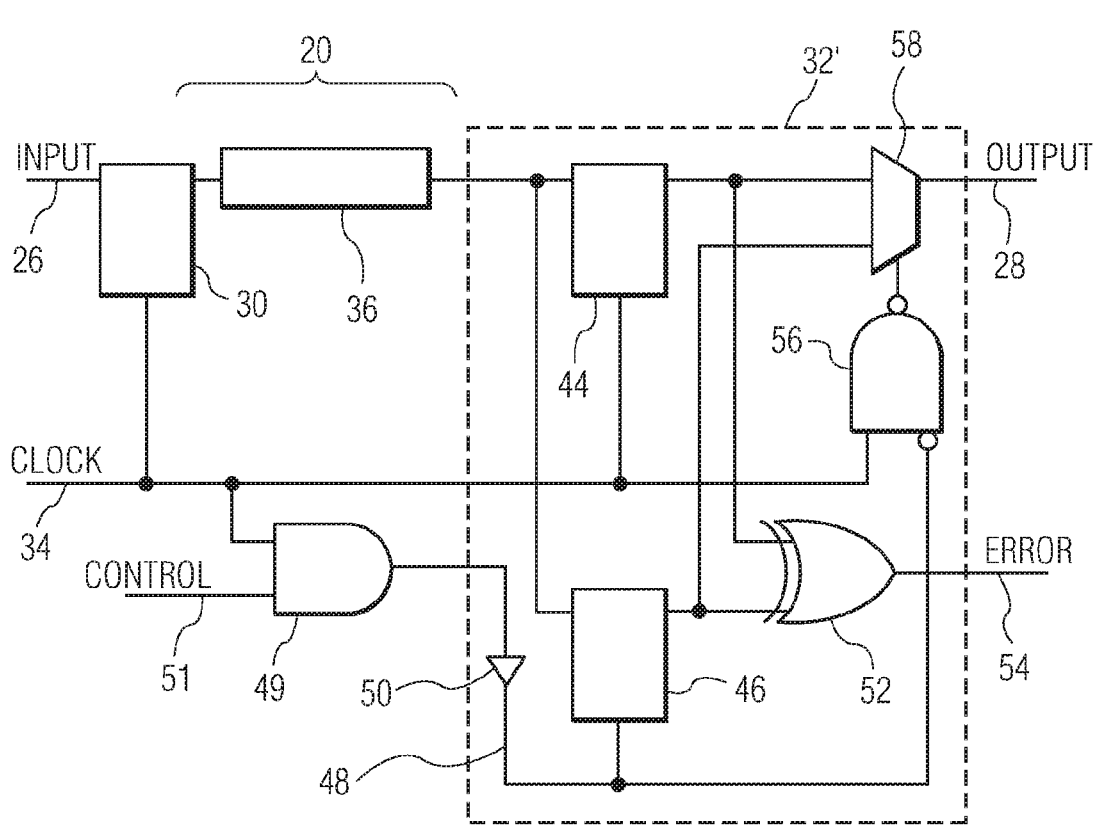
FIG. 4 illustrates a processing stage and a double-sampling arrangement according to an embodiment of the invention.

With reference to FIG. 4, the present invention handles these timing errors by replacing the receiving flip-flop 32 of each 'relaxed' or 'under-designed' path by a double-sampling arrangement 32', e.g. a pair of double-sampling flip-flops. FIG. 4 illustrates a first processing stage 20 comprising processing logic for performing a processing operation on an input signal 26 to generate at least one output signal 28. The input signal 26 corresponds to an output signal of a previous processing stage (not shown). An input flip-flop 30 samples the input signal 26 synchronously with a clock signal 34. Element 36 indicates a data path through the first processing stage which has been under-designed. As an example, the path 36 has been optimized between −2σ and +2σ, whereas the IC in which the processing stage 20 is comprised is designed to operate over a range of −3σ to +3σ.

The double-sampling arrangement 32' comprises a first sampling element 44 and a second sampling element 46, each in the form of a flip-flop. The first flip-flop 44 is adapted to sample a first value of the output signal 28 of the first processing stage 20 synchronously with the regular clock signal 34. The second flip-flop 46 is adapted to sample a second value of the output signal 28 synchronously with a delayed clock signal 48. The delayed clock signal 48 is a delayed version of the regular clock signal 34 and is selectively enabled by a first delayed clock signal generator 49, 50, comprising a delay element 50 or delay line, in response to a control signal 51 generated in the previous processing stage (not shown).

The values of the output signal 28 latched by the first and second flip-flops 44, 46 are compared. If they are equal, it means that the first flip-flop 44 sampled the correct value. If they are different, the data signal took longer than the clock period to propagate through the processing stage 20. The delay between the regular clock signal 34 and the delayed clock signal 48 is selected such that, even under worst-case combinations of process and operating conditions (e.g. at 3σ), the propagation delay of path 36 through the processing stage 20 does not exceed the sum of the clock period and the delay. Thus the second flip-flop 46 latches the correct value of the output signal 28. As an example, the clock period is 10 nanoseconds (clock frequency 100 MHz) and the delay between the regular clock signal 34 and delayed clock signal 48 is 2 nanoseconds.

Comparison circuitry in the form of an XOR gate 52 compares the first and second values of the output signal 28 sampled by the first and second flip-flops 44, 46 respectively and generates an error signal 54 if the values are different. The output signal 28 of the first processing stage 20 becomes the input signal of a following processing stage (not shown in FIG. 4). If the values of the output signal 28 sampled by the first and second flip-flops 44, 46 are different, the value sampled by the second flip-flop 46 is propagated to the following processing stage, by means of further circuitry 56, 58.

Static timing analysis (STA) tools can be used to find failing receiving flip-flops after a BTWC design of one or more functional units and netlist editing tools can be used to replace the failing flip-flop with a double-sampling arrangement 32' as described above. Because the functional units in the failing paths were designed to have less area margin, it is known where the system will fail.

When a path 36 through the functional unit is longer than the clock period, the correct value of the output signal 28 is clocked by the second flip-flop 46 at the delayed clock signal 48 and propagated to the following processing stage. Since the following processing stage then receives its input value at the delayed clock signal 48 timing rather than at the regular clock signal 34 timing, the signal may not propagate through the following processing stage before the next cycle of the regular clock signal 34 in all cases. Various approaches can be used to mitigate timing problems in the following processing stage due to this delay, three of which will be described here with reference to FIGS. 5 to 8, in which elements corresponding to those shown in FIG. 4 are indicated by the same reference numbers.

Figure 5:
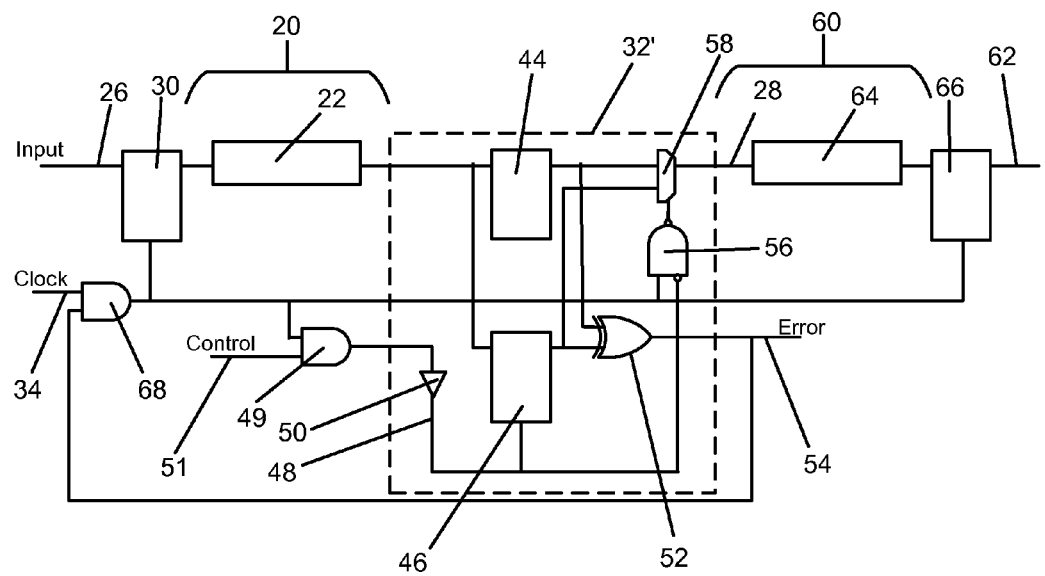
FIG. 5 illustrates a 'clock-skipping' technique for error recovery in accordance with another embodiment of the present invention.

The first approach, known as clock skipping, is illustrated in FIG. 5. The output signal 28 from the first processing stage 20 becomes the input signal of a following processing stage 60, and is latched by the second flip-flop 46 at a given cycle of the delayed clock signal 48. The following processing stage 60 comprises processing logic for performing a processing operation on the output signal 28 of the first processing stage 20 to generate a further output signal 62. A data path 64 through the following processing stage 60 is shown. The value of the further output signal 62 is sampled by a following-stage receiving flip-flop 66 synchronously with the regular clock signal 34. In the event of a timing error in the first processing stage 20, the error signal 54 output by the comparison circuitry 52 is used by clock-disabling circuitry 68 to disable the next cycle of the clock signal 34. This approach will gives a time equal to twice the period of the regular clock signal 34 to the full system to recover from the error.

Figure 6:
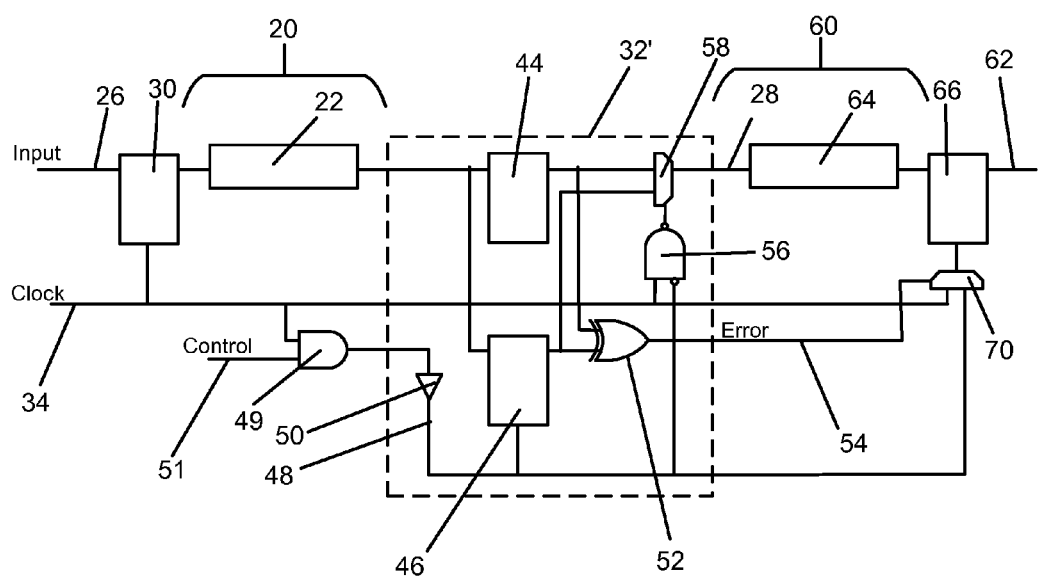
FIG. 6 illustrates a 'stealing time' technique for error recovery in accordance with another embodiment of the present invention.

Another approach, illustrated in FIG. 6, effectively 'steals time' from the next clock cycle in the following processing stage 60. In the event of a timing error in the first processing stage 20, the delayed clock signal 48 is used to clock the following-stage receiving flip-flop 66, rather than the regular clock signal 34. The error signal 54 is used to control switching circuitry 70 to select between the regular clock signal 34 and the delayed clock signal 48. This approach gives the clock period plus the delay of the delayed clock signal to the fully system to recover from the error. This approach will give the full system a time equal to the sum of the period of the clock signal 34 and the delay between the regular clock signal 34 and the delayed clock signal 48 to recover from the error.

Figure 7:
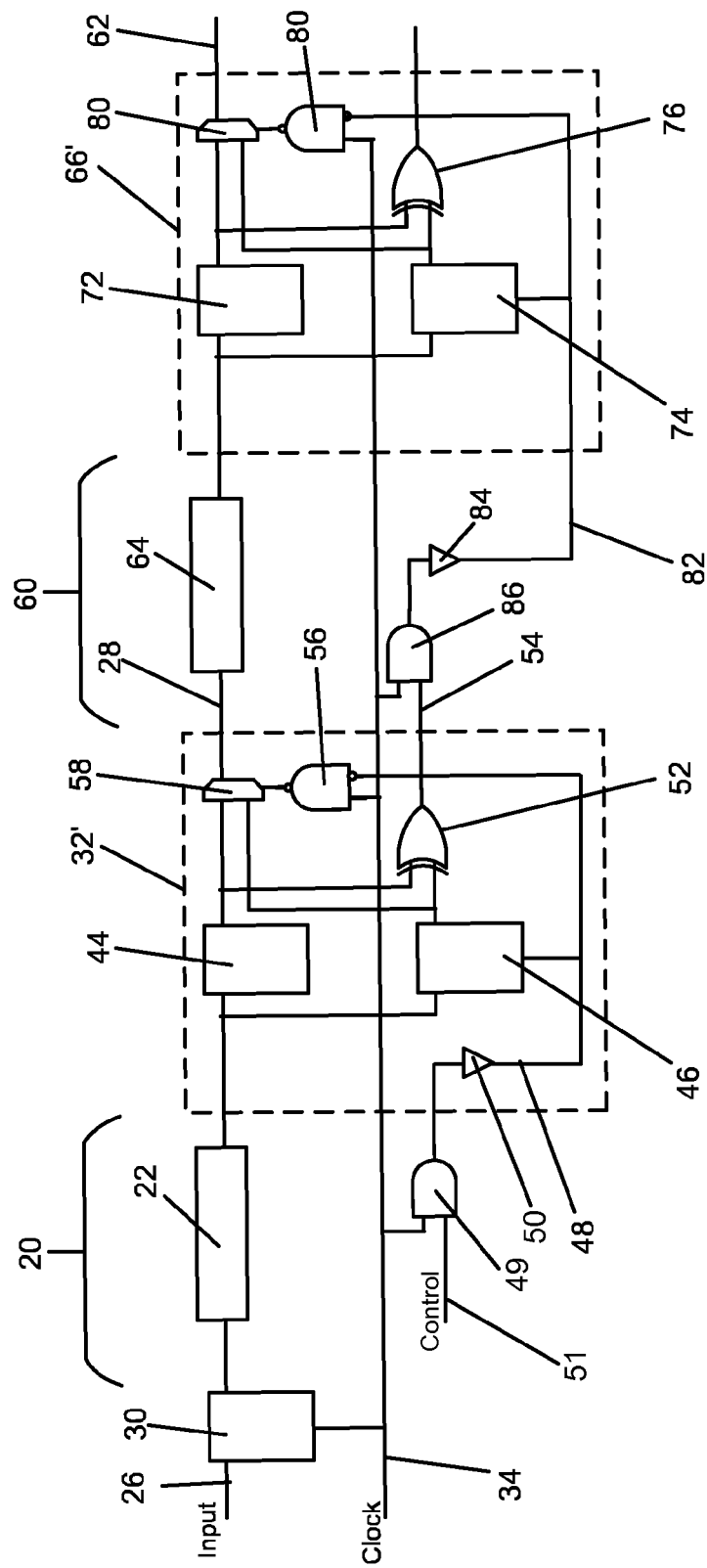
FIG. 7 illustrates a 'time-borrowing' technique for error recovery in accordance with another embodiment of the present invention.

In yet another approach, illustrated in FIG. 7, the system effectively 'borrows time' from the following processing stage 60. In the event of a timing error in the first processing stage 20, the error signal 54 is used to enable a further double sampling arrangement 66' for sampling the further output signal 62 of the following processing stage 60. The further double-sampling arrangement 66' comprises third and fourth sampling elements 72, 74, in the form of third and fourth flip-flops 72, 74 respectively, together with comparison circuitry 76 and switching circuitry 78, 80 as described in connection with the double-sampling arrangement 32'. The third flip-flop 72 is adapted to sample a first value of the further output signal 62 synchronously with the clock signal 34. The fourth flip-flop 74 is adapted to sample a second value of the further output signal 62 synchronously with a second delayed clock signal 82. The second delayed clock signal 82 is selectively enabled by a second delayed clock signal generator 84, 86, in response to the error signal 54 from the first processing stage 20. The second delayed clock signal 82 is generated by propagating the regular clock signal 34 through a delay element 84. The delay is equal to the delay of the first delayed clock signal 48. In this arrangement, the timing error of the first processing stage 20 is masked. If there is another timing error in the following processing stage 60, previous strategies can be used. However the probability of two critical paths being executed in consecutive processing stages 20, 60 is much lower than the probability of an error in the first processing stage 20. That means that, in this 'time borrowing' approach, the performance penalty will be lower than in the previous two approaches.

Figure 8:
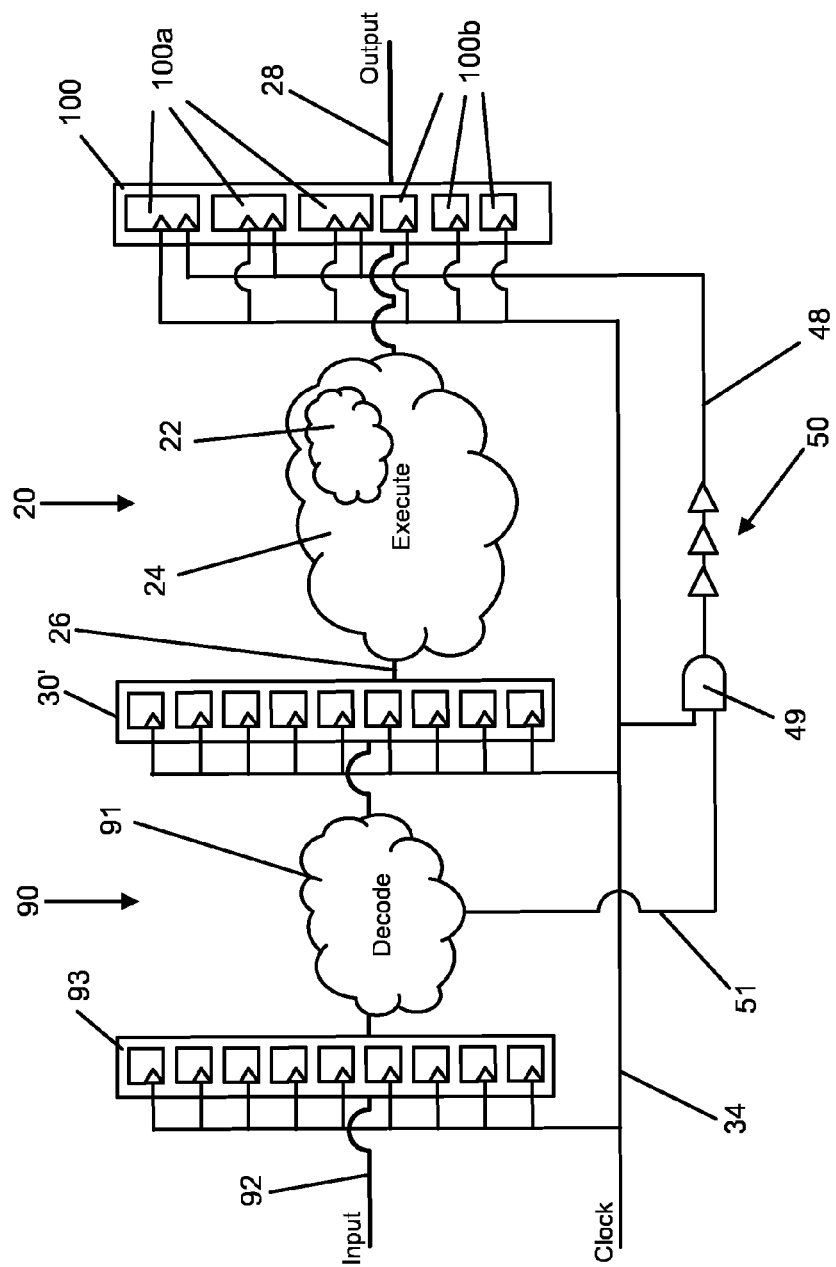
FIG. 8 illustrates two consecutive processing stages according to an embodiment of the present invention.

FIG. 8 shows the first processing stage 20 proceeded by a previous processing stage 90. Here, the previous processing stage 90 is a decode stage, comprising decode processing logic 91. The first processing stage 20 is the execute stage and includes a functional unit 22 comprising a multiplier or divider in addition to other processing logic 24. An input signal 92 for the previous processing stage 90 is sampled by a first bank of flip-flops 93 synchronously with the clock signal 34. The output signal 26 of the previous processing stage 90 becomes the input signal 26 of the first processing stage 20 and is sampled by the input flip-flops 30' of the first processing stage 20, synchronously with the clock signal 34. A bank of flip-flops 100 is provided for sampling the value of the output signal 28 of the first processing stage 20.

The functional unit 22 is under-designed so that it has less area margin than that allowed under conventional design approaches and it is therefore known where the system is likely to fail under non-typical conditions. The end points of paths through the functional unit 22 are therefore replaced by a double-sampling arrangement 100 including pairs of first and second flip-flops 100a. In each pair 100a, the first flip-flop is clocked by the regular clock signal 34, while the second flip-flop is clocked by the delayed clock signal 48. Note that paths through the first processing stage 20 but which do not pass through the functional unit 22 terminate in single flip-flops 100b clocked by the regular clock signal 34, thereby saving power and area. Thus the bank of flip-flops 100 at the end of the first processing stage 20 comprises both double sampling flip-flops 100A and single flip-flops 100B.

In the decode processing stage 90 of this processor, it is already known that the multiplier or divider 22 will be used in the first processing stage 20, and the processing logic 91 of the decode processing stage 90 is arranged to output a control signal 51 indicating if the multiplier or divider 22 is to be used. For example, the control signal 51 may be output whenever an instruction to use the functional unit 22 is decoded. The first delayed clock signal generator 49, 50 is adapted to selectively enable the first delayed clock signal 48 in response to the control signal 51. For this purpose, the control signal 51 is gated with the clock signal 34 at circuit element 49.

By selectively enabling the first delayed clock signal 48 in response to the control signal 51, the first delayed clock signal 48 is only enabled when it is likely to be required. This feature reduces the occurrence of the so-called 'hold problem', which can arise when double-sampling elements are used. If the time taken for a next-cycle signal to propagate through the processing stage 20 is shorter than the delay between the regular clock signal 34 and the delayed clock signal 48, the second flip-flop 46 may clock the correct output value of the next-cycle output signal 28, after the first flip-flop 44 clocks the correct output value of the output signal 28 for the current cycle. This results in an apparent error, since the two flip-flops 44, 46 clock different values, even though this is not due to a timing violation of the type intended to be dealt with by the double sampling flip-flops 44, 46. Various techniques are known for dealing with the hold problem, for example by putting buffers in short paths. However, these incur further area overhead.

By using a control signal 51 generated in the previous processing stage 90, the delayed clock signal 48, and therefore the second flip-flop 46, is enabled only when the functional unit 22 is to be used. This reduces the occurrence of the hold problem because the second flip-flop 46 is not enabled at any other time. It is therefore not necessary to include buffers in short paths which finish in a double-sampling arrangement 32', 100 but which do not cross the functional unit 22, thereby avoiding additional area.

Typically, paths through the functional unit 22 (e.g. a multiplier or divider) are not short paths and do not result in generation of the hold problem described above. In the example above, the delayed clock signal 48 will be enabled whenever the functional unit 22 is used, for short or long paths. Further improvement can be obtained by enabling the delayed clock signal 48, for example in the case in which the functional unit 22 is a multiplier, only when the multiplier is about to multiply two large numbers, but not when two small numbers are to be multiplied.

Because the control signal 51 is generated in the previous processing stage 90, prior to the signal advancing to the first processing stage 20, there is sufficient time for the delayed clock signal 48 to be propagated to the second flip-flop 46, 100a at the end of the first processing stage 20 so that the double sampling arrangement 32', 100 is enabled at the correct time.

Because the delayed clock signal 48 is selectively enabled by the control signal 51, the delayed clock signal 48 will not appear every cycle, but will occur intermittently when a call to the functional unit 22 is made.

In another embodiment the delayed clock signal 48 may be enabled by the control signal 51 described above in conjunction with a pipeline advance signal (not shown in FIG. 8). The pipeline advance signal may be required to ensure that the delayed clock signal 48 supplied to the second flip-flop 46, 100a is generated at the appropriate time, i.e. when the multiply/divide instruction in the decode processing stage 90 advances to the execute processing stage 20. This may be needed, for example, if the current instruction in the execute processing stage 20 of the pipeline stalls, or if the current instruction in the execute processing stage 20 is a multi-cycle instruction and the functional unit 22 is not pipelined.

It will be appreciated by persons skilled in the art that the above embodiments have been described by way of example only, and not in any limitative sense, and that various alterations and modifications are possible without departure from the scope of the invention as defined by the appended claims.

The invention claimed is:

1. An integrated circuit, comprising:
   a first processing stage comprising processing logic for performing a processing operation on at least one input signal to generate at least one output signal, wherein said input signal corresponds to an output signal of a previous processing stage;
   a first sampling element adapted to sample a first value of said output signal synchronously with a clock signal;
   a second sampling element adapted to sample a second value of said output signal synchronously with a first delayed clock signal; and
   a first delayed clock signal generator, adapted to selectively enable said first delayed clock signal, in response to a control signal generated in said previous processing stage; and
   comparison circuitry for comparing said first and said second values of said output signal and generating an error signal if said first and second values are different;
   wherein, if said first and second values are different, said second value is propagated to a following processing stage.

2. An integrated circuit according to claim 1, wherein said processing logic comprises a functional unit.

3. An integrated circuit according to claim 2, wherein said control signal is enabled by said previous processing stage when said functional unit is to be used.

4. An integrated circuit according to claim 3, wherein said previous processing stage is a decode processing stage.

5. An integrated circuit according to claim 3, wherein a timing of said control signal is controlled by a pipeline advance signal.

6. An integrated circuit according to claim 2, wherein said functional unit comprises a multiplier or a divider.

7. An integrated circuit according to claim 1, wherein a maximum time for completing said processing operation is less than the sum of a period of the clock signal and a delay between the clock signal and the first delayed clock signal.

8. An integrated circuit according to claim 1, wherein said output signal of said first processing stage becomes the input signal of a following processing stage.

9. An integrated circuit according to claim 1, wherein said first and/or second sampling element is a flip-flop.

10. An integrated circuit according to claim 1, wherein a next cycle of the clock signal is disabled in response to said error signal.

11. An integrated circuit according to claim 1, wherein the first delayed clock signal is propagated to the following processing stage in response to said error signal.

12. An integrated circuit according to claim 1, wherein the following processing stage comprises:
   further processing logic for performing a further processing operation on said output signal to generate at least one further output signal;
   a third sampling element adapted to sample a first value of said further output signal synchronously with the clock signal;
   a fourth sampling element adapted to sample a second value of said further output signal synchronously with a second delayed clock signal; and
   a second delayed clock signal generator, adapted to selectively enable said second delayed clock signal in response to said error signal.

13. An integrated circuit according to claim 1, wherein said integrated circuit comprises a data processor.

14. An integrated circuit according to claim 1, wherein said integrated circuit comprises a microcontroller, a digital signal processor or a graphics processing unit.

15. An integrated circuit, comprising:
   a first processing stage comprising processing logic for performing a processing operation on at least one input signal to generate at least one output signal, wherein said input signal corresponds to an output signal of a previous processing stage;
   a first sampling element adapted to sample a first value of said output signal synchronously with a clock signal;

a second sampling element adapted to sample a second value of said output signal synchronously with a first delayed clock signal; and a first delayed clock signal generator, adapted to selectively enable said first delayed clock signal, in response to a control signal generated in said previous processing stage;

wherein a maximum time for completing said processing operation is less than the sum of a period of the clock signal and a delay between the clock signal and the first delayed clock signal.

16. An integrated circuit, comprising:

a first processing stage comprising processing logic for performing a processing operation on at least one input signal to generate at least one output signal, wherein said input signal corresponds to an output signal of a previous processing stage;

a first sampling element adapted to sample a first value of said output signal synchronously with a clock signal;

a second sampling element adapted to sample a second value of said output signal synchronously with a first delayed clock signal; and a first delayed clock signal generator, adapted to selectively enable said first delayed clock signal, in response to a control signal generated in said previous processing stage;

wherein said processing logic comprises a functional unit;

wherein said control signal is enabled by said previous processing stage when said functional unit is to be used; and wherein the timing of said control signal is controlled by a pipeline advance signal.

* * * * *